(12) United States Patent
Tessnow et al.

(10) Patent No.: US 7,923,907 B2
(45) Date of Patent: Apr. 12, 2011

(54) LED LAMP ASSEMBLY

(75) Inventors: Thomas Tessnow, Weare, NH (US);
Kim Albright, Warner, NH (US);
Michael Tucker, Henniker, NH (US)

(73) Assignee: Osram Sylvania Inc., Danvers, MA (US)

( * ) Notice: Subject to any disclaimer, the term of this patent is extended or adjusted under 35 U.S.C. 154(b) by 157 days.

(21) Appl. No.: 12/355,881

(22) Filed: Jan. 19, 2009

(65) Prior Publication Data

US 2010/0181885 A1    Jul. 22, 2010

(51) Int. Cl.
*F21V 29/00* (2006.01)
*F21S 4/00* (2006.01)
*H01J 1/62* (2006.01)

(52) U.S. Cl. .......... 313/46; 313/498; 362/294; 362/800
(58) Field of Classification Search ............ 313/498, 313/46; 362/294, 800
See application file for complete search history.

(56) References Cited

U.S. PATENT DOCUMENTS

| | | | |
|---|---|---|---|
| 6,773,138 B2 * | 8/2004 | Coushaine | 362/656 |
| 6,827,469 B2 | 12/2004 | Coushaine | |
| 6,880,962 B2 | 4/2005 | Coushaine | |
| 7,086,767 B2 | 8/2006 | Sidwell | |
| 7,121,687 B2 | 10/2006 | Sidwell | |
| 7,261,437 B2 | 8/2007 | Coushaine | |
| 2008/0074884 A1 * | 3/2008 | Mok et al. | 362/294 |

* cited by examiner

*Primary Examiner* — Karabi Guharay
(74) *Attorney, Agent, or Firm* — Edward S. Podszus

(57) ABSTRACT

A robust LED lamp may be assembly by forming a heat sinking sandwich with two metal heat sinks positioned around the circuit board and pinned together a heat conductive element. The assembly is positioned by pressing it into a base providing electrical connections. The robust assembly is rapidly assembled, thermally effective in draining or spreading heat from the circuit board and is readily adaptable to a variety of applications lighting. The heat sink may be decorated, colored or otherwise esthetically enhanced for consumer appreciation.

9 Claims, 4 Drawing Sheets

US 7,923,907 B2

LED LAMP ASSEMBLY

CROSS-REFERENCE TO RELATED APPLICATIONS

Not applicable.

BACKGROUND OF THE INVENTION

1. Field of the Invention

The invention relates to electric lamps and particularly to LED electric lamps. More particularly the invention is concerned with LED lamps with heat sinks for rapid manufacture.

2. Description of the Related Art Including Information Disclosed Under 37 CFR 1.97 and 1.98

LED lamps are being developed as exterior vehicle light sources. A frequent problem is to dispose of the excess heat while at the same time protecting the LED light source or chip. One method has been to use a flexible substrate and wrap that LED support onto a heat sinking body. The warping technique relies on an essentially fragile, or perhaps more accurately less robust substrate. A flexed substrate may be less reliable in manufacture or use. Certainly the flexing and positioning of the substrate offers opportunities in manufacture for error in construction. Another method has been to form some or all for the base with a heat sinking element, such as a metal core or similar heat transferring element. The most desirable place for the heat sink to extend to is the exterior and open air. This has lead to base structures with enclosed heat sinks or heat sinks passing through to the outside. This requires co-molding, or some other method of constructing the multi-component base which can be expensive. This contrasts with the molded plastic base with a staked in lamp source and electrical connections. There is then a need for an LED lamp structure that is robust, easy to make and capable of distributing a substantial heat flow from one or more LEDs.

BRIEF SUMMARY OF THE INVENTION

An LED lamp assembly may be made with a planar circuit board having a substantially greater length and width than thickness, defining a first major side and a second major side. At least one LED is mounted on a major side of the circuit board. An electrical coupling is extended from an end of the circuit board for electrical connection. Electrical circuitry is supported on the circuit board, coupling the at least one LED to the electrical coupling. A first heat sink with a planar face is sized and shaped to substantially span and fit side by side to a major side of the circuit board. The heat sink is formed with recesses or openings of sufficient size and shape to mechanically accommodate any adjacent electrical components formed on the circuit board, and includes at least one recess receiving the at least one LED permitting the transmission of light from the at least one LED to the exterior of the lamp assembly. The planar side of the first heat sink is mechanically positioned in close thermal contact with a major side of the circuit board. The circuit board and heat sink assembly form an axially extending body having substantially greater length and width than thickness, with the electrical coupling extending beyond the periphery of the first heat sink exposed for electrical connection. A base is mechanically coupled to the circuit board and heat sink assembly, and has at least one latching face for mechanically coupling the lamp assembly in a lamp socket.

DETAILED DESCRIPTION OF THE INVENTION

Figure 1:
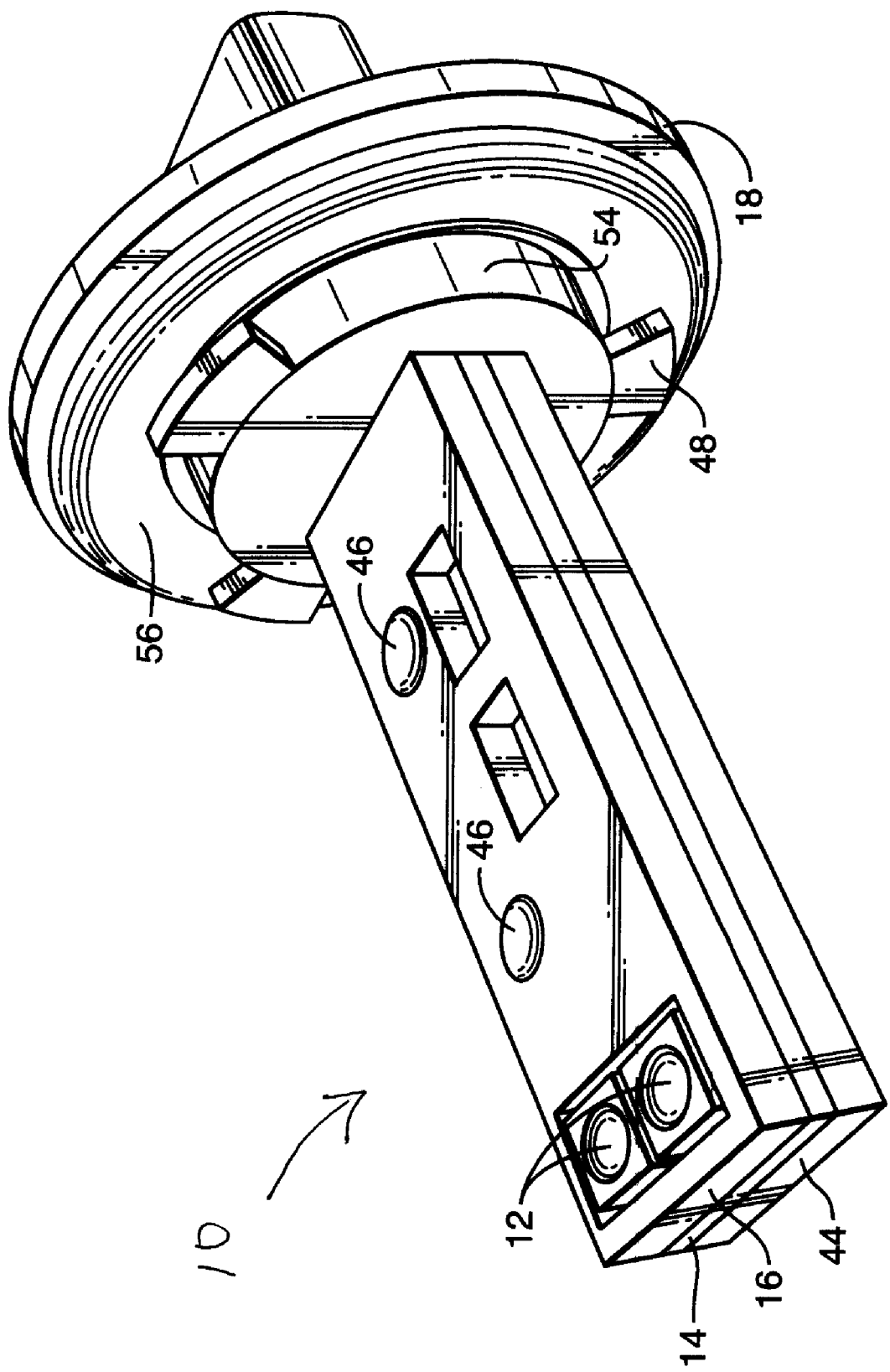
FIG. 1 shows a front perspective view of a preferred embodiment of a LED Lamp Assembly.

FIG. 1 shows a front perspective view of a preferred embodiment of a LED lamp assembly 10. The LED lamp assembly 10 is formed generally with at least one LED 12, a circuit board 14, a heat sink 16, and a base 18. The preferred LED may be an LED enclosed in a carrier (TOPLED), or may be an open LED chip (chip on board).

Figure 2:
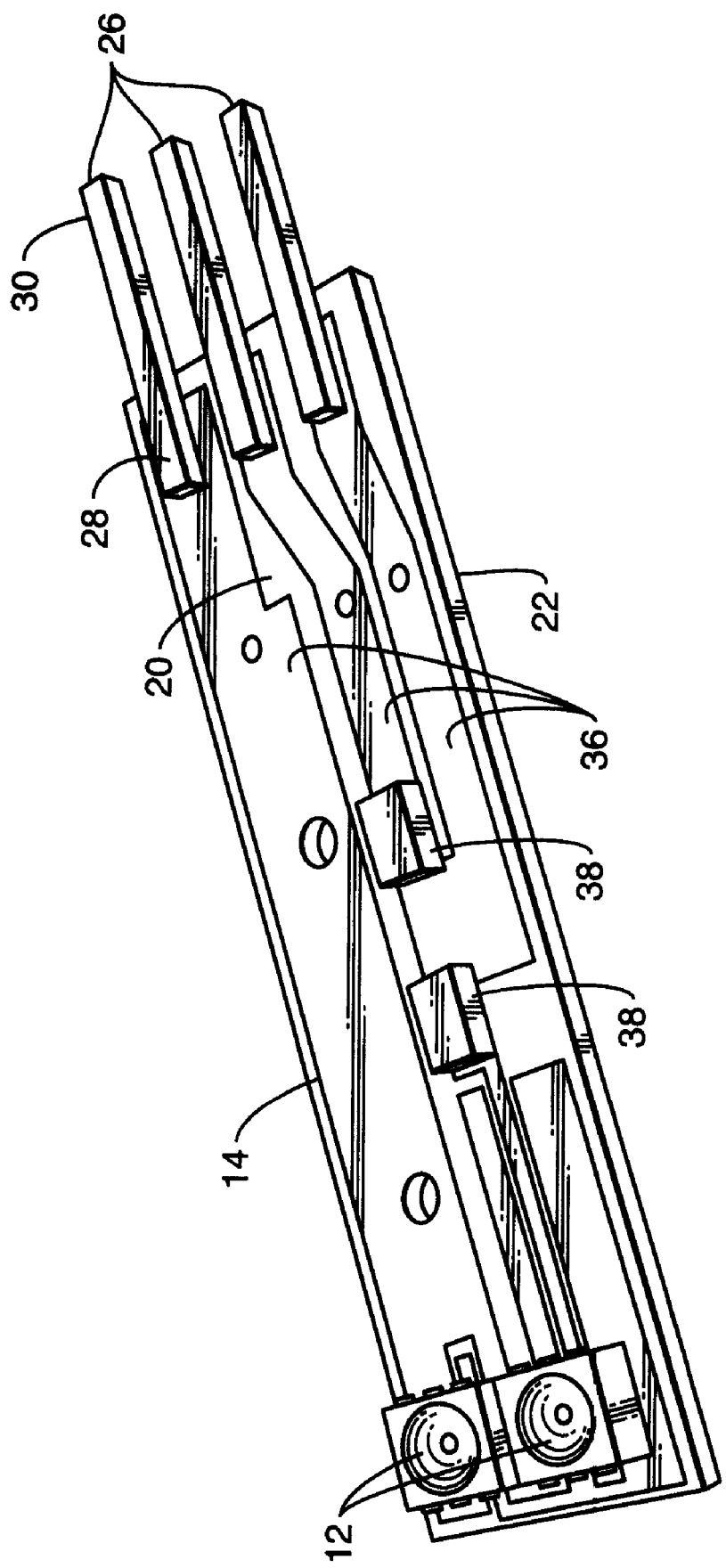
FIG. 2 shows a perspective view of a preferred embodiment of a circuit board.

FIG. 2 shows a perspective view of a preferred embodiment of a circuit board 14. The circuit board 14 is a planar circuit board 14 having a first major side 20 and a second major side 22. The preferred circuit board 14 is made from a heat conductive material, such as aluminum coated as needed with electrically insulating layers on one or both sides. Another possible circuit board type is the metal core board, which has an additional aluminum core to conduct heat and which is insulated on one or both sides. The preferred circuit board 14 has a greater length and width than thickness and has the general form of an elongated rectangle. The circuit board 14 may be one typical of LED lamps supporting electrical circuits, having a heat conductive layer, electrically insulating layers, or patterns, and electrically conductive patterns for delivering electrical power to the LEDs and or other electrical devices mounted to the circuit board. The preferred circuit board is made of a thin insulating material with copper traces on one or both sides for electrical connection and thermal conduction to the heat sinks. The copper traces are coated with a thin insulating lacquer to avoid electrical contact to the heat sink. In one embodiment the circuit board 14 was 3.0 cm long, 1.0 cm wide and 1.0 mm thick.

At least one LED 12 is electrically coupled to the circuit board 14. Preferably a plurality of LEDs 12 is mounted on both the first major side 20 and the second major side 22 of the circuit board 14. The LEDs 12 may be LED assemblies (TOPLEDs) mounted on the circuit board 14, or may be LED chips mounted directly on the circuit board 14 (chip on board). The preferred LEDs 12 all provide white light, but it is understood the LEDs may be of differing colors (red, blue, green, white) and the circuitry 36 may selectively illuminate individually or in combinations, the various LEDs 12 for differing purposes. For example, one set of LEDs may provide only white light, (back up lighting), an alternative set may provide only red light (brake lighting) another set of LEDs may provide amber light for flashing functions (turn or warning) and so on.

An electrical coupling 24 extends from the circuit board 14 for connection to an electrical power source and any relevant signal control input. The electrical coupling 24 may comprise lugs 26 that are electrically coupled to the circuit board 14 at first ends 28 and are extended at second ends 30 into the socket cavity 34 of the base 18 where second ends 30 may be adapted for plug connection, as in a socket receptacle. Alternatively, the lugs may be electrically connected in the base to other shaped socket connectors, such as blades, spring faces, bayonet couplings and so on so as to adapt the base for electrical and mechanical coupling into other styles of lamp mountings, and electrical connections.

Formed on the electrical board may be electrical circuitry 36 and including related components 38 supported on the circuit board 14 and coupling the at least one LED 12 to the electrical coupling 24.

Figure 3:
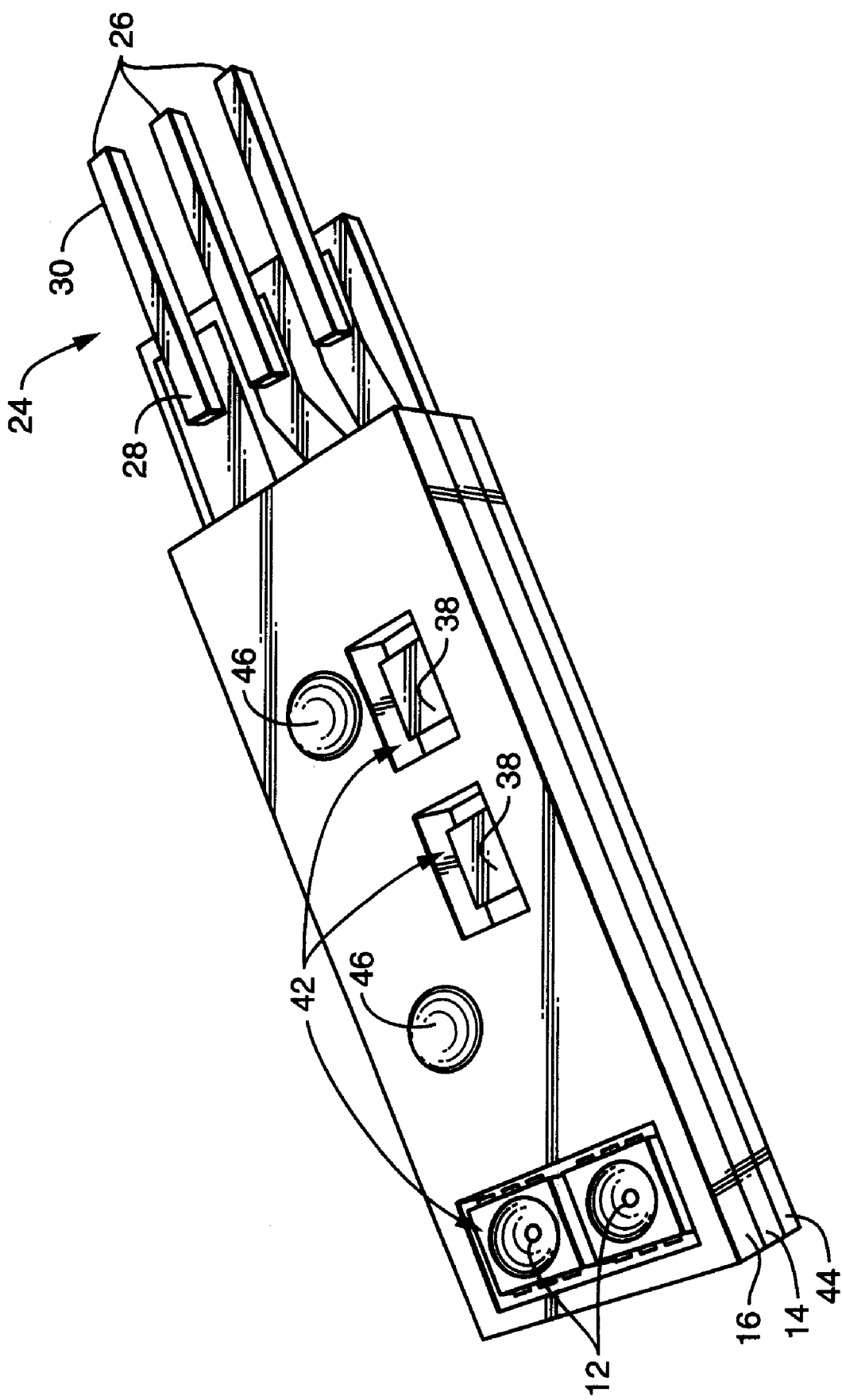
FIG. 3 shows a perspective view of a preferred embodiment of a circuit board and LED assembly.
Figure 4:
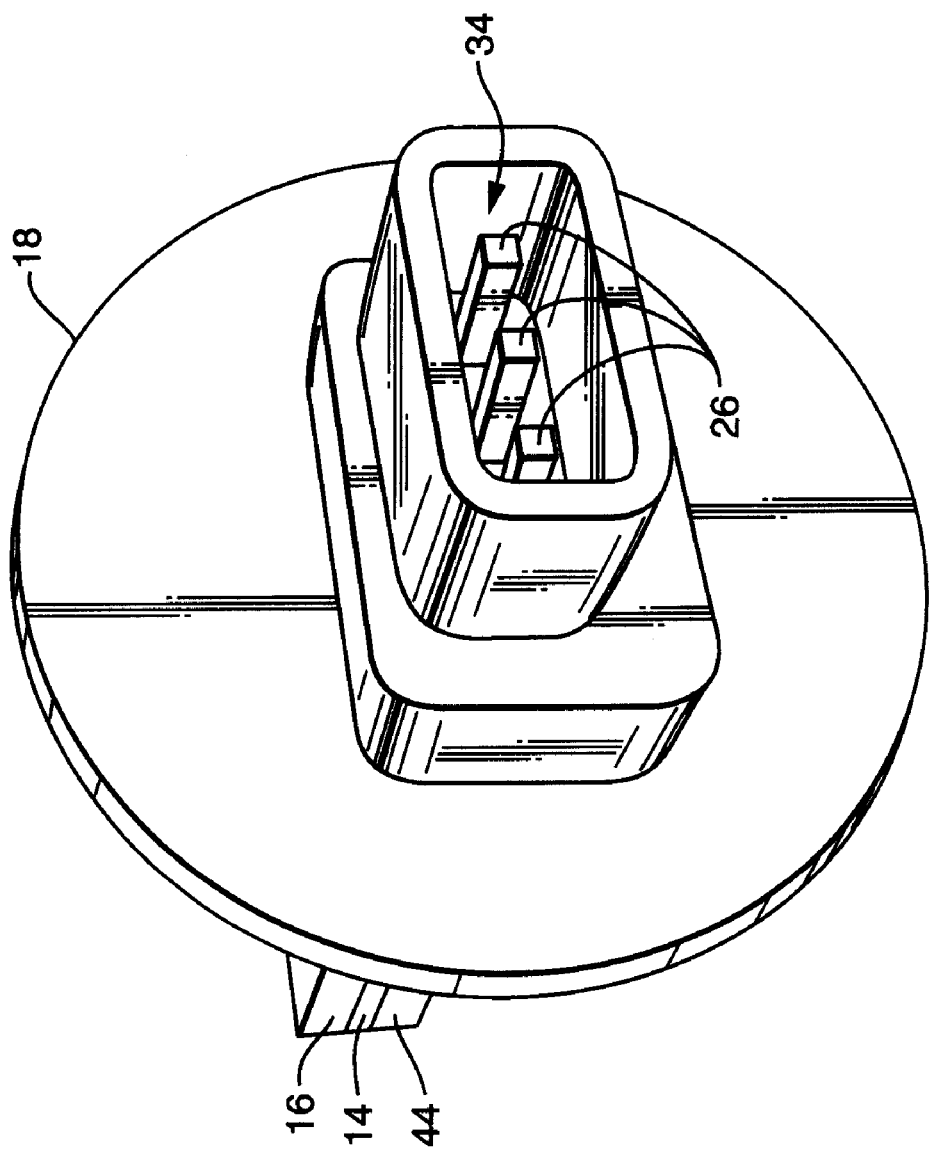
FIG. 4 shows a rear perspective view of a preferred embodiment of a circuit board and heat sink assembly.

FIG. 3 shows a perspective view of a preferred embodiment of a circuit board and LED assembly. The first heat sink 16 has a planar face that substantially abuts the first major side 20 of the circuit board 14. The preferred first heat sink 16 is made from metal, such as copper, aluminum or others and has the general form of an elongated rectangle similar in size and shape to the circuit board 14. In one embodiment the first heat sink 16 was made of aluminum and was 3.0 cm long, 1.0 cm wide and 2.0 mm thick. The first heat sink 16 is otherwise shaped to include one or more recesses 42 or openings that span or fit corresponding electrical components 38 formed on the circuit board 14. The first heat sink 16 includes at least one open recess 42 for receiving the at least one LED 12. The open recess 42 permits the transmission of light from the at least one LED 12 to the exterior of the lamp assembly. The planar side of the first heat sink 16 is mechanically bound in close thermal contact with a major side of the circuit board 14. Heat from the circuit board 14, and heat from the at least one LED 12 is then substantially transmitted to the heat sink 16, where it is spread over a larger area, exposed to greater radiation or cooling effects and otherwise effectively removed from the circuit board 14 and or LED 12. The circuit board 14 and heat sink 16 form an axially extending body extending from the electrical coupling 24. The electrical coupling 24 extends beyond the respective peripheries of the circuit board 14 and the heat sink(s) 16, 44 to be exposed for electrical connection.

A similar second heat sink 44 may be mechanically coupled to the second major side 22 of the circuit board 14. The second heat sink 44 has a planar face that substantially abuts the second major side 22 of the circuit board 14. The first and second heat sinks 16, 44 then sandwich the circuit board 14, capturing the circuit board 14 intermediate first heat sink 16 and the second heat sink 44.

The preferred first heat sink 16 and the second heat sink 44 are mechanically coupled one to the other through or around the circuit board 14, foe example with rivets or similar mechanical fasteners 46 It is understood that the circuit board 14 or the heat sink 16 may be electrically insulated one from the other, at least in the relevant areas, by coating, such as lacquer or insertion of an intermediate insulating layer. The first heat sink 16 and second heat sink 44 then press against the intermediate circuit board 14 for good thermal contact with the circuit board 14. The preferred first heat sink 16 and the second heat sink 44 are riveted with rivets 46 one to the other to press against the intermediate circuit board 14. The circuit board 14, or the first heat sink 16 and second heat sink 44 may have formed end features adjacent the base to enhance coupling and alignment of the circuit board 14 and heat sink 16, 44 assembly with the base 18. The exposed exterior surfaces of the heat sink may be modified for additional heat dispersion with ribs, fins or similar feature, or may be colored or textured for to aid heat radiation, improve light emission, decrease glare or improve appearance (black, true color, white, silver, mirror reflective, dimpled, sand blasted, and so on).

A base 18 is mechanically coupled to the circuit board 14 and heat sink assembly. The preferred base 18 is made from molded plastic of sufficient heat tolerance so as to accommodate the support of the LED circuit board 14 and heat sink 16, 44 assembly. The preferred base 18 has the general form of a cylindrical cup with latching flange 48 structure extending radially from the side of the cylindrical base 18. The base 18 includes a recess for receiving and supporting the circuit board 14 and heat sink assembly 16, 44. The recess may include formed latching and aligning features to receive and mechanically couple with the circuit board 14 and heat sink 16, 44 assembly. In one embodiment, the circuit board 14 and heat sink 16, 44 assembly had a base end formed as a flat tongue, and the recess was correspondingly formed with a rectangular slot to enable the insertion (coupling) of the circuit board 14 and heat sink 16, 44 assembly into the base 18. Alternatively the circuit board 14 and heat sink 16, 44 assembly may be co-molded in the base 18. Formed in the bottom of the base 18 is a socket cavity 34 for sheltering the electrical couplings 24, such as lugs 26, electrically connected to the circuit board 14, and extended through the end wall into the socket cavity 34. The base 18 has at least one latching face 54 for mechanically coupling the lamp assembly 10 in a lamp socket. The preferred latching face 54 is a bayonet type mounting. The latched mounting may be keyed according to differing lamp structures and purposes, so that a tail lamp may be similarly made to a turn signal lamp, but the two lamp types are distinctly keyed to prevent confused use in actual application. The preferred base 18 includes a seal 56 element positioned adjacent the latching face 54 to exclude water and other environment features that may disrupt the lamp function over time. A compressible o-ring or annular seal 56 for example may be used as the seal.

While there have been shown and described what are at present considered to be the preferred embodiments of the invention, it will be apparent to those skilled in the art that various changes and modifications can be made herein without departing from the scope of the invention defined by the appended claims.

What is claimed is:

1. An LED lamp assembly comprising:
a planar circuit board having a substantially greater length and width than thickness, and having a first major side and a second major side;
at least one LED mounted on one of said major sides of the circuit board;
an electrical coupling extending from an end of the circuit board;
electrical circuitry supported on the circuit board and coupling the at least one LED to the electrical coupling;
a first heat sink having a planar face sized and shaped to substantially span and fit side by side to said first major side of the circuit board, the heat sink including recesses or openings of sufficient size and shape to mechanically accommodate any adjacent electrical components formed on the circuit board, and including at least one recess receiving the at least one LED and permitting the transmission of light from the at least one LED to the exterior of the lamp assembly, the planar side of the first heat sink being mechanically positioned to be in close thermal contact with said first major side of the circuit board;
a second heat sink mechanically coupled to the second major side of the circuit board, the first and second heat sinks being riveted one to the other to press against the circuit board disposed intermediate said first and second heat sinks;
the circuit board and first and second heat sinks forming a circuit board and heat sink assembly defining an axially extending body having substantially greater length and width than thickness, the electrical coupling extending beyond the periphery of the first heat sink exposed for electrical connection; and a base mechanically coupled to the circuit board and heat sink assembly, and having at least one latching face for mechanically coupling the lamp assembly in a lamp socket.

2. The LED lamp assembly in claim 1, wherein the second heat sink is similar to the first heat sink and is mechanically coupled to the second major side of the circuit board, the first and second heat sinks capturing the circuit board intermediate the first heat sink and the second heat sink.

3. The LED lamp assembly in claim 1, wherein the first heat sink and the second heat sink are formed separate from the circuit board.

4. The LED lamp assembly in claim 1, wherein the electrical coupling comprises lugs electrically coupled to the circuit board and extended into the socket cavity of the base.

5. The LED lamp assembly in claim 1, wherein the base includes a seal element positioned adjacent the latching face.

6. The LED lamp assembly in claim 1, wherein the base includes a bayonet latch and a ring seal.

7. An LED lamp assembly comprising:
   a planar circuit board having substantially, greater length and width than thickness, and having a first major side and a second major side;
   at least one LED mounted on the circuit board;
   an electrical coupling extending from the circuit board, the electrical coupling comprising lugs electrically coupled to the circuit board;
   electrical circuitry and components supported on the circuit board and coupling the at least one LED to the electrical coupling;
   a first heat sink having substantially greater length and width than thickness, and having a planar face, the first heat sink including recesses or openings sufficient to mechanically accommodate any corresponding electrical components formed on the circuit board, and including at least one recess receiving the at least one LED permitting the transmission of light from the at least one LED to the exterior of the lamp assembly, the first heat sink being formed separate from the circuit board and the planar face of the first heat sink being mechanically positioned to be in close thermal contact with the first major side of the circuit board;
   the circuit board and the first heat sink forming an axially extending body having substantially greater length and width than thickness;
   a second heat sink being formed separate from the circuit board and mechanically coupled to the second major side of the circuit board, the circuit board being disposed intermediate the first heat sink and the second heat sink;
   the first heat sink and the second heat sink riveted one to the other to press against the circuit board;
   wherein the electrical coupling extends beyond respective peripheries of the first heat sink and the second heat sink so as to be exposed for electrical connection; and
   a base mechanically coupled to the axially extending body, the base having at least one latching face for mechanically coupling the lamp assembly in a lamp socket, the base including a seal element positioned adjacent the latching face.

8. The LED lamp assembly in claim 7, wherein the lugs extending form the circuit board extend through the socket cavity of the base for electrical coupling.

9. The LED lamp assembly in claim 7, wherein the second heat sink is similar to the first heat sink.

* * * * *